United States Patent
Lee

(10) Patent No.: US 10,014,338 B2
(45) Date of Patent: Jul. 3, 2018

(54) IMAGE SENSOR

(71) Applicant: Samsung Electronics Co., Ltd., Suwon-si (KR)

(72) Inventor: Kyung-Ho Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/671,546

(22) Filed: Aug. 8, 2017

(65) Prior Publication Data
US 2018/0102389 A1    Apr. 12, 2018

(30) Foreign Application Priority Data
Oct. 12, 2016    (KR) .................... 10-2016-0132006

(51) Int. Cl.
| | |
|---|---|
| *H01L 27/146* | (2006.01) |
| *H04N 5/232* | (2006.01) |
| *H04N 5/225* | (2006.01) |
| *G02B 7/36* | (2006.01) |

(52) U.S. Cl.
CPC .... *H01L 27/14625* (2013.01); *H01L 27/1463* (2013.01); *H01L 27/14621* (2013.01); *H01L 27/14627* (2013.01); *H01L 27/14645* (2013.01); *H04N 5/2254* (2013.01); *H04N 5/23212* (2013.01); *G02B 7/365* (2013.01)

(58) Field of Classification Search
CPC ......... H01L 27/14625; H01L 27/14621; H01L 27/14627; H01L 27/1463; H01L 27/14645; H04N 5/2254; H04N 5/23212; G02B 7/365
See application file for complete search history.

(56) References Cited

U.S. PATENT DOCUMENTS

| | | |
|---|---|---|
| 7,312,093 B2 | 12/2007 | Ryu |
| 8,119,439 B2 | 2/2012 | Park |
| 8,378,440 B2 | 2/2013 | Kwon et al. |
| 9,263,485 B2 | 2/2016 | Furuta |
| 9,276,032 B2 | 3/2016 | Suzuki et al. |
| 9,307,170 B2 | 4/2016 | Numata |
| 2013/0032915 A1 | 2/2013 | Tonotani et al. |
| 2016/0054172 A1 | 2/2016 | Roh et al. |
| 2016/0112138 A1 | 4/2016 | Alfiad et al. |

(Continued)

FOREIGN PATENT DOCUMENTS

| | | |
|---|---|---|
| JP | 2014-093343 A | 5/2014 |
| JP | 2015-032610 A | 2/2015 |

*Primary Examiner* — Karen Kusumakar
(74) *Attorney, Agent, or Firm* — Muir Patent Law, PLLC

(57) ABSTRACT

An image sensor includes multiple unit pixels defined by a pixel isolation layer on a substrate, at least a pair of photoelectric converters in each of the unit pixels and at least an optical divider on a rear surface of the substrate at each of the unit pixels. The photoelectric converters are separated by at least a converter separator in each of the unit pixels and generate photo electrons in response to an incident light that is incident to an incident point of the respective unit pixel. The optical divider is overlapped with the incident point and divides the incident light into a plurality of split lights having the same amount of light such that each of the photoelectric converters receives the same amount of light from the split lights.

20 Claims, 15 Drawing Sheets

(56) References Cited

U.S. PATENT DOCUMENTS

| | | |
|---|---|---|
| 2016/0172390 A1 | 6/2016 | Numata |
| 2016/0240570 A1* | 8/2016 | Barna .............. H01L 27/14605 |
| 2016/0349522 A1* | 12/2016 | Onuki .................. H04N 5/374 |
| 2017/0077154 A1* | 3/2017 | Numata ............ H01L 27/14623 |

* cited by examiner

IMAGE SENSOR

CROSS-REFERENCE TO RELATED APPLICATIONS

This application claims priority under 35 U.S.C § 119 to Korean Patent Application No. 10-2016-0132006 filed on Oct. 12, 2016 in the Korean Intellectual Property Office, the contents of which are incorporated by reference herein in its entirety.

BACKGROUND

1. Field

Example embodiments relate to an image sensor, and more particularly, to a CMOS image sensor having a plurality of photoelectric converters.

2. Description of the Related Art

Auto focusing (AF) technology has been widely adapted in recent image sensors. Particularly, phase difference auto focusing (PAF) technology has been intensively adapted in image sensors for realizing high focusing speed. According to PAF technology, a light passing through an imaging lens of an imaging device such as a camera is divided into split beams and the split beams are individually detected at different focus detection pixels as focus detection signals corresponding to respective focus detection pixels. Then, a focusing lens is automatically controlled in such a way that the focus detection signals have the same intensity at the same optical phase, to automatically determine the focal distance of the image sensor.

In general, auto focusing is conducted by using an auto focusing (AF) sensor or a plurality of focus detection pixels. The AF sensor is provided with the imaging device including the image sensor and has a much smaller size than that of the image sensor. In contrast, the focus detection pixels are provided with the image sensor together with the image detection pixels. That is, the image sensor includes an image detection module in which the image detection pixels are arranged and an AF module in which the focus detection pixels area arranged, so that focus detection and image detection are conducted in a single image sensor.

Recently, each pixel of the image sensor comprises a pair of photoelectric converters, regardless of the AF module and the image detection module, which is widely known as a dual pixel image sensor. Thus, the PAF is conducted at each pixel in the dual pixel image sensor which remarkably increases the speed and accuracy of the auto focusing. Particularly, since every unit pixel of the image sensor is formed into the dual pixel having the pair of the photoelectric converters without any additional AF module, the focal point or the focal distance of the image sensor can be accurately and automatically detected without any deteriorations of image quality.

In the operation of a dual pixel image sensor, a pair of image signals is generated from each unit pixel and the intensity of each image signal is individually varied according to its own phase in an image signal diagram. When each signal line of the image signals crosses each other and the image signals of the unit pixel have the same intensity in the image signal diagram, the very phase of the cross point where the signal lines cross each other is selected as a focus phase of the unit pixel. Then, a focus lens can be controlled in such a way that a light beam is irradiated thereon at each focus phase of each unit pixel of the image sensor.

However, since the penetration depth of a light beam is varied according to the wavelength thereof and the phase of the image signal may be varied by the penetration depth, the focus phases of each primary color light are also different in the dual pixel image sensor which generally deteriorate the AF accuracy and the image quality of the dual pixel image sensor.

SUMMARY

Exemplary embodiments of the herein described subject matter provide an image sensor having an optical splitter on each unit pixel in which at least a pair of photoelectric converters is arranged such that the same amount of light is supplied to each of the photoelectric converters.

According to exemplary embodiments, there is provided an image sensor including a plurality of unit pixels defined by a pixel isolation layer on a substrate, a plurality of photoelectric converters in each of the unit pixels and at least an optical divider on a rear surface of the substrate in each of the unit pixels. The photoelectric converters may be separated by at least a converter separator in each of the unit pixels and may generate photo electrons in response to an incident light that may be incident to an incident point of each unit pixel. The optical divider may be overlapped with the incident point and may divide the incident light into a plurality of split lights such that each of the photoelectric converters may receive substantially the same amount of light.

According to exemplary embodiments, there is provided another image sensor including a pixel array for generating a plurality of image signals in response to an incident light and an image signal processor electrically connected to the pixel array and processing the image signals. The pixel array may include a plurality of unit pixels defined by a pixel isolation layer on a substrate, a plurality of photoelectric converters in each of the unit pixels and at least an optical divider on a rear surface of the substrate at each of the unit pixels. The photoelectric converters may be separated by at least a converter separator in each of the unit pixels and may generate photo electrons in response to the incident light that may be incident to an incident point of the respective unit pixel and the optical divider may be overlapped with the incident point and may divide the incident light into a plurality of split lights such that each of the photoelectric converters may receive substantially the same amount of light.

According to exemplary embodiments, the optical divider having the refractive index smaller than surroundings may be arranged on the boundary area of the photoelectrical converters and may be overlapped with the incident point at every unit pixel of the image sensor. Thus, the photoelectric converters may have substantially the same amount of light and the image signals generated from each of the photoelectric converters may have substantially the same intensity. As a result, the cross point of the image signals generated from each of the photoelectric converters may have similar phase irrespective of the wavelength of the slanted beam, so that the phase difference of each cross points of the image signals generated from the red, blue and green pixels are substantially negligible regardless of the wavelength of the slanted beam, thereby increasing the accuracy of the phase different auto focusing (PAF) and the image quality of the image sensor.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION

Figure 1:
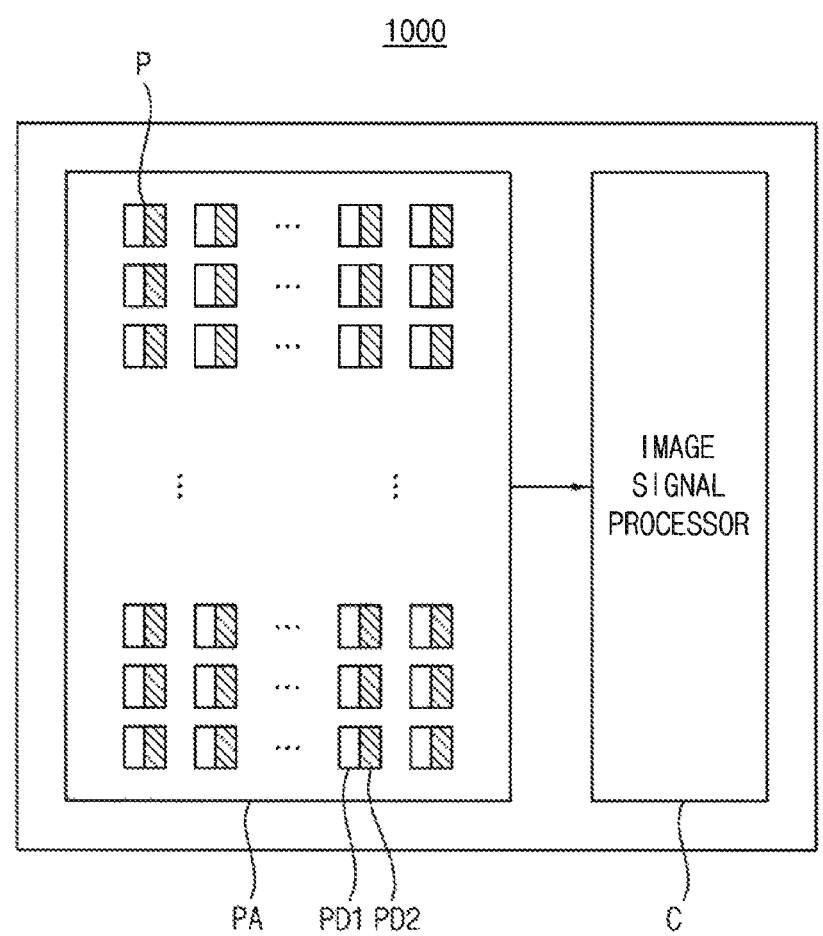
FIG. 1 is a structural view illustrating an image sensor in accordance with an example embodiment.

Reference will now be made to the exemplary embodiments, which are illustrated in the accompanying drawings, wherein like reference numerals may refer to like components throughout.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). Embodiments described herein will be described referring to plan views and/or cross-sectional views by way of ideal schematic views. Accordingly, the exemplary views may be modified depending on manufacturing technologies and/or tolerances. Therefore, the disclosed exemplary implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 2:
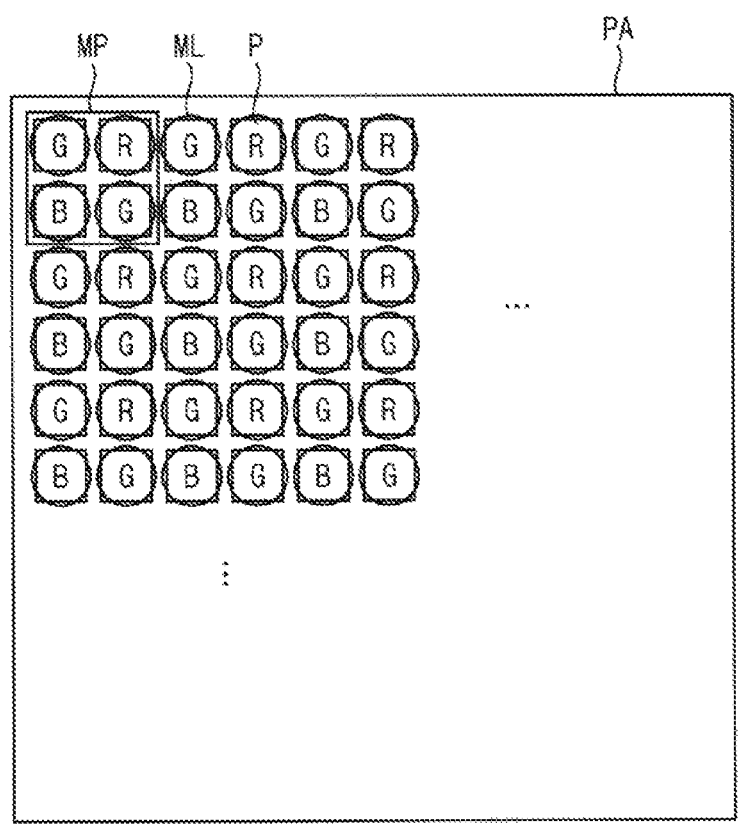
FIG. 2 is a layout of a pixel array of the image sensor shown in FIG. 1.
Figure 3:
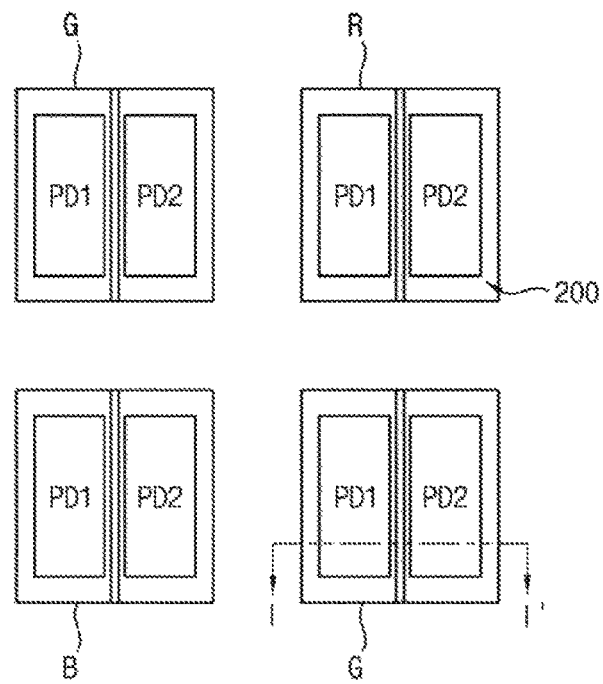
FIG. 3 is a view illustrating a unit pixel of the pixel array shown in FIG. 2.
Figure 4:
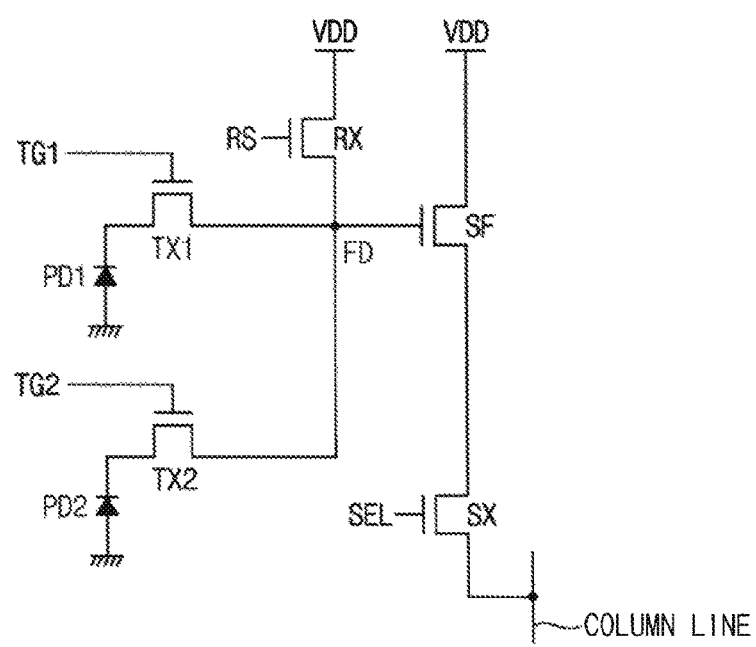
FIG. 4 is a circuit diagram of the unit pixel shown in FIG. 3.

FIG. 1 is a structural view illustrating an image sensor in accordance with an exemplary embodiment, and FIG. 2 is a layout of a pixel array of the image sensor shown in FIG. 1. FIG. 3 is a view illustrating a unit pixel of the pixel array shown in FIG. 2 and FIG. 4 is a circuit diagram of the unit pixel shown in FIG. 3.

As shown in FIGS. 1 to 4, an image sensor 1000 in accordance with an exemplary embodiment may include a pixel array PA for generating image signals and an image signal processor C for processing the image signals. The pixel array PA may include a plurality of unit pixels P in which an incident light may be converted into electrical signals corresponding to an object, so the image signals corresponding to the object may be generated as digital signals from the pixel array PA. The digital image signals may be electrically processed in the image signal processor C, thereby forming a digital image data for the object.

A plurality of the unit pixels P may be arranged into a matrix in the pixel array PA and the electric signal generated from each unit pixel P may be controlled by a row driver (not shown) and a column driver (not shown). The row driver may determine an exposure time of each unit pixel along a row direction of the matrix, so the image signal may be generated from the unit pixel under the control of the row driver. The column driver may select and activate the unit pixel along a column direction of the matrix, so the image signals may be selectively detected from the column directional unit pixels in the pixel array PA. The row driver and the column driver may be provided in the image signal processor C.

The unit pixel P may include at least a photoelectric converter 200 for generating photoelectrons in response to the incident light and a plurality of image signal detectors for detecting the photoelectrons and reading out the image signal. Thus, the image signal detector may be connected with the row driver and the column driver. For example, the image signal detector may include a transfer transistor TX, a reset transistor RX, a source-follower transistor SF and a selection transistor SX.

Figure 5:
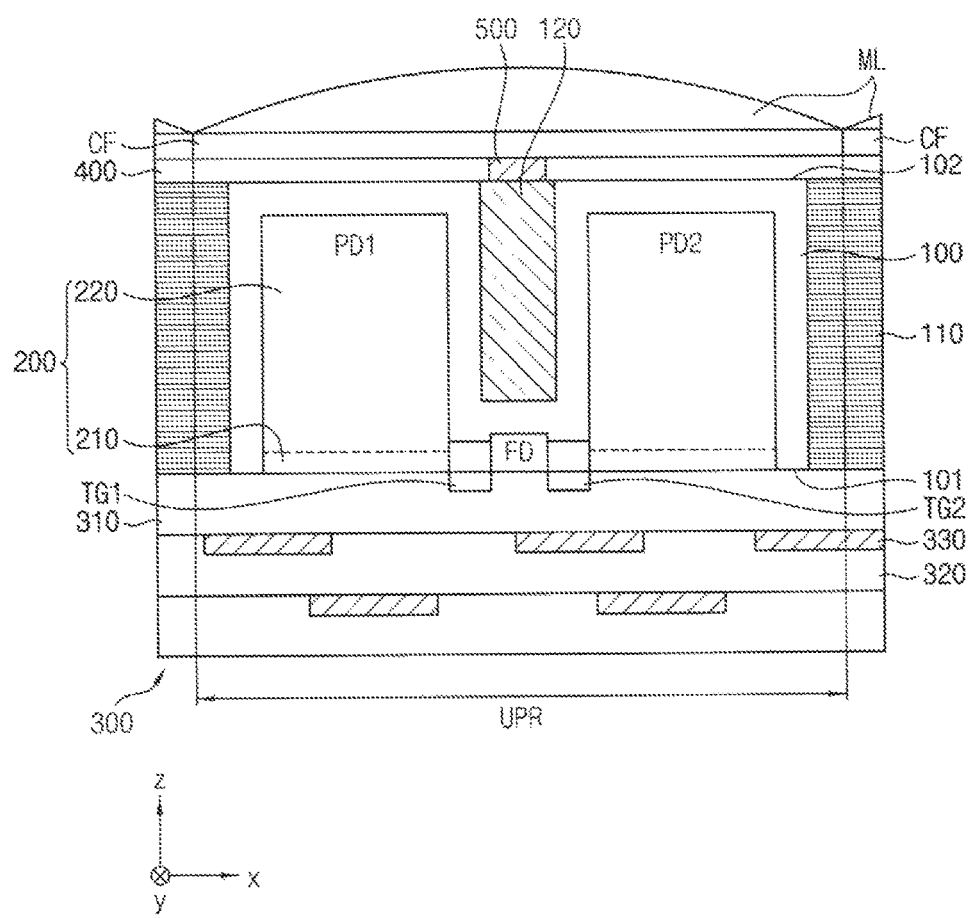
FIG. 5 is a cross sectional view cut along a line I-I' of the unit pixel shown in FIG. 3.

As shown in FIG. 5, a color filter CF and a micro lens ML may be arranged on each unit pixel P, so a specific light having a specific wavelength may pass through the color filter CF and reach the unit pixel P under the corresponding color filter CF. Particularly, the color filter CF may be arranged in such a way that only the primary color light having its own wavelength may pass through the color filter CF and each of the unit pixels P may correspond to one of the primary color lights. In the present exemplary embodiment, the color filter CF may be arranged on the unit pixels P with a bayer pattern and four unit pixels P may be configured into an image mosaic pixel MP for a unit of the image mosaic in a shape of a 2×2 matrix. For example, a pair of unit pixels which a green light may reach (green pixel), a unit pixel which a red light may reach (red pixel) and a unit pixel which a blue light may reach (blue pixel) may be provided for the image mosaic pixel MP.

Particularly, a plurality of the photoelectric converters 200 may be arranged in every unit pixel P, so both of the image generation and the auto focusing may be conducted in the same unit pixel P. In the present exemplary embodiment, a pair of the photoelectric converters 200 may be provided with the unit pixel P. For example, the photoelectric converter 200 may include at least one of a photo diode PD, a photo gate and a pinned photo diode (PPD).

The photoelectric converters 200 of the unit pixel P may generate the photoelectrons individually, so the image signal may be independently generated from each of the photoelectric converters 200. The intensity of each image signal of the unit pixel P may be varied according to its own phase, and the phase at which the image signals may have the same intensity may be selected as the focal phase. The focal point of the image sensor 1000 may be automatically determined in such a way that the light may be incident to each of the unit pixels P at the focal phase. Thus, the AF may be conducted just by the unit pixel P of the image sensor 1000 without any AF modules and without any deteriorations of the image quality.

In the present exemplary embodiment, the photoelectric converter 200 may include a pair of first and second photo diodes PD1 and PD2 that may be separated by a converter separator 120. Thus, the primary color light may be split and supplied to each of the first and the second photo diodes PD at the unit pixel P, so the photoelectrons may be individually generated from the first and the second photo diodes PD1 and PD2.

As schematically shown in FIG. 4, the photoelectrons generated from the first and the second photo diodes PD1 and PD2 may be transferred to a floating diffusion area FD by first and second transfer transistors TX1 and TX2.

The reset transistor RX may periodically reset the floating diffusion area FD. A source electrode of the reset transistor RX may be connected to the floating diffusion area FD and a drain electrode of the reset transistor RX may be connected to an electric power. When the reset transistor RX may be turned on in response to a reset signal RS, a power voltage VDD may be applied to the floating diffusion area FD via the drain electrode of the reset transistor RX, thereby resetting the floating diffusion area FD.

The source-follower transistor SF may be combined with a constant current source (not shown) which may be arranged out of the unit pixel P, and may function as an amplifier by which an electrical potential of the floating diffusion area FD may be amplified.

The selection transistor SX may select the unit pixel P from a pixel row of the pixel array PA and the image signal may be read out from the selected unit pixel P. When the selection transistor SX may be turned on by a bias signal of a row selection line SEL, an electric power VDD that may be connected to a drain electrode of the source-follower transistor SF may be applied to the drain electrode of the selection transistor SX.

Gate lines TG1, TG2, RS and SEL of the transfer transistor TX, the reset transistor RX and the selection transistor SX may extend in a row direction, so a plurality of the unit pixels in the pixel row may be simultaneously activated in the pixel array PA.

FIG. 5 is a cross sectional view cut along a line I-I' of the unit pixel shown in FIG. 3.

As shown in FIGS. 1 to 5, a plurality of the unit pixels P may be arranged on a substrate 100 and may be electrically isolated by a pixel isolation layer 110. A pair of the photoelectric converters 200 may be arranged in the unit pixel P and an optical divider 500 may be provided on the unit pixel P. The photoelectric converters 200 may be separated by the converter separator 120 in the unit pixel P and the incident light may be divided into a number of divided lights, i.e. as many as the number of the photoelectric converters 200.

In an example, the substrate 100 may include a semiconductor substrate having semiconductor materials or a semiconductor layer. For example, the substrate 100 may include a silicon wafer doped with dopants or a silicon-on-insulator (SOI) substrate. The substrate 100 may have a front surface on which a wiring structure 300 may be arranged and a rear surface 102 that may be opposite to the front surface 101.

In the present exemplary embodiment, the substrate 100 may include a semiconductor substrate doped with p-type dopants and the color filter CF and the micro lens ML may be arranged on a rear surface 102 of the substrate 100. Thus, the light may be supplied onto the rear surface of the substrate 100 and the image sensor 1000 may be configured into a backside illumination (BSI) structure.

The pixel isolation layer 110 may define a unit pixel region UPR as active regions of the substrate 100 that may be isolated from each other for generating photo electrons in the unit pixel P. For example, the pixel isolation layer 110 may include a penetration structure across the front surface 101 and the rear surface 102.

In the present exemplary embodiment, the pixel isolation layer 110 may include a deep trench isolation (DTI) layer comprising insulation materials in which the refractive index may be smaller than that of the substrate 100. Thus, the light that may be incident to the unit pixel region UPR may be refracted to the photoelectric converters 200. For example, the pixel isolation layer 110 may include one of a nitride and polysilicon doped with dopants.

The converter separator 120 may extend into the substrate 100 from the rear surface 102 in such a way that the convertor separator 120 may be interposed between the photoelectric converters 200 in the unit pixel P. For example, the converter separator 120 may be provided as the DTI layer.

Particularly, the converter separator 120 may comprise a low-refractive material having a refractive index smaller than that of the substrate 100, so the divided lights that may be supplied to each of the photoelectric converters 200 may be prevented from being mixed up or interfered with each other. That is, the photoelectric converters 200 may be optically isolated in the unit pixel P by the converter separator 120.

Particularly, the optical divider 500 may be positioned on the converter separator 120 and may comprise a low-refractive material of which the refractive index may be less than or equal to that of the converter separator 120. In addition, the refractive index of the optical divider 500 may also be smaller than that of a buffer layer 400 that will be described hereinafter. Therefore, the refractive index of the converter separator 120 may be greater than or equal to that of the optical divider 500 and may be smaller than that of the substrate 100.

When the optical divider 500 may have the same refractive index as the converter separator 120, the light that may be incident onto the unit pixel P may be divided directly toward each photoelectric converter 200. In contrast, when the optical divider 500 may have the refractive index less than that of the converter separator 120, the light that may be incident onto the unit pixel P may be divided and refracted deeper into the substrate 100. That is, the divided light may reach deeper in the substrate 100 than when the optical divider 500 may have the same refractive index as the converter separator 120. Therefore, the divided light may reach a deeper area of the substrate in the pixel P and the amount of light may increase at a deep area of the substrate 100.

In the deep area of the substrate 100, the divided light may be refracted from the converter separator 120 toward the photoelectric converter 200 in a width direction of the unit pixel rather than a depth direction thereof, because the refraction index of the photoelectric converter 200 may be larger than that of the converter separator 120. Thus, the optical efficiency of the photoelectric converter 200 may increase in the unit pixel P.

A pair of the photoelectric converters 200 may be in the unit pixel region UPR of the substrate 100. For example, the photoelectric converter 200 may include a diode structure having a first impurity area 210 and a second impurity area stacked on the first impurity area 210. In the present exemplary embodiment, the photoelectric converter 200 may include first and second photo diodes PD1 and PD2 that may be spaced apart by a gap distance in a first direction x.

While the present exemplary embodiment discloses the photoelectric converters 200 may include a pair of the photo diodes PD1 and PD2, three or more photo diodes may also be provided as the photoelectric converters 200 according to the configurations and characteristics of the image sensor 1000. For example, the photoelectric converters 200 may include four photo diodes that may be arranged in a 2×2 matrix along the first and the second directions x and y.

The first impurity area 210 may be adjacent to the front surface 101 of the substrate 100 and may be doped with p-type dopants and the second impurity area 220 may extend toward the rear surface 102 of the substrate 100 from the first impurity area 210 and may be doped with n-type dopants. The floating diffusion area FD may be provided at a surface portion of the substrate 100 close to the front surface 101 between the pair of the photoelectric converters 200 and may be doped with dopants of which the conductivity type may be different from that of the substrate 100. For example, the floating diffusion area FD may be doped with n-type or p-type dopants.

First and second transfer gates TG1 and TG2 may be arranged on the front surface of the substrate 100 and the photoelectrons of the first and the second photo diodes PD1 and PD2 may be individually transferred to the floating diffusion area FD by the first and the second transfer transistors TX1 and TX2, respectively. The first and the second transfer gates TG1 and TG2 may be gate electrodes of the first and the second transfer transistors TX1 and TX2, so the photo electrons of the first and the second photo diodes PD1 and PD2 may be individually and independently transferred to the floating diffusion area FD by the first and the second transfer transistors TX1 and TX2 that may be individually operated in response to the reset signals.

While the present exemplary embodiment discloses that the transfer gates TG1 and TG2 may be arranged on the front surface 101 of the substrate 100 as a flat type, any other gate structures such as a recess type or a buried type that may be recessed from the front surface 101 of the substrate 100 may also be used for the transfer gates TG1 and TG2.

The floating diffusion area FD may include a well region doped with n-type dopants around the first face 101 in the unit pixel region UPR. An electron buffer (not shown) for temporarily storing the photo electrons may also be further provided with the unit pixel region UPR. The photo electrons generated from the photo diodes PD1 and PD2 may be temporarily stored in the electron buffer to a transfer density and then the photo electrons in the electron buffer may be transferred on a whole to the floating diffusion area FD, thereby preventing an image distortion caused by the time delay of the photo electron transfer.

The wiring structure 300 may be arranged on the first face 101 of the substrate 100. For example, the wiring structure 300 may include an insulation interlayer 310 covering the transfer transistor TX on the first face 101, a plurality of inter-wiring insulation layers 320 on the insulation interlayer 310 and a plurality of wires 330 on the inter-wiring insulation layers 320. The wires 330 may include a plurality of signal lines connected to the various transistors TX, RX, SX and SF and subsidiary lines connected to the image signal process C.

A buffer layer 400 may be arranged on the second face 102 of the substrate 100. The buffer layer 400 may include at least one of a planarization layer, an anti-reflective layer and a protection layer, so a single layer or a multilayer may be used for the buffer layer 400. In the present example embodiment, the buffer layer 400 may include a multilayer having the anti-reflective layer.

The optical divider 500 may be arranged in/on the buffer layer, thus the light that may be incident on the unit pixel P may be divided into the divided lights that may be individually supplied to each photo diodes PD1 and PD2. Particularly, the optical divider 500 may have the refractive index smaller than that of the buffer layer 400 and be positioned on the converter separator 120 at a boundary area of the photo diodes PD1 and PD2.

FIGS. 6A to 6E are cross sectional view illustrating exemplary embodiments of the optical divider shown in FIG. 5.

The optical divider 500 may include a linear pattern extending on the boundary area of the photo diodes PD1 and PD2 or a line trench that may be selectively filled with air along the boundary area of the photo diodes PD1 and PD2.

Figure 6A:
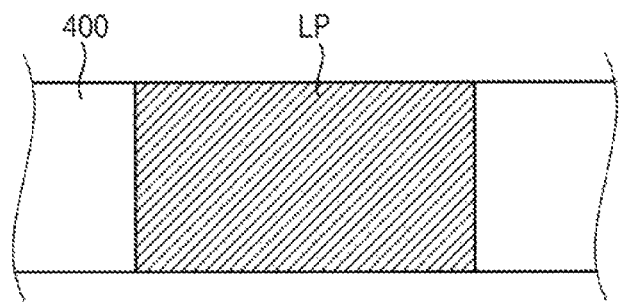
FIGS. 6A to 6E are cross sectional view illustrating example embodiments of the optical divider shown in FIG. 5.

For example, as shown in FIG. 6A, the optical divider 500 may include a line pattern LP that may penetrate through the buffer layer 400. Particularly, a lower surface of the line pattern LP may be contact with the converter separator 120 and an upper surface of the line pattern LP may be coplanar with an upper surface of the buffer layer 400. When the buffer layer 400 may include an anti-reflective layer comprising a nitride, the line pattern LP may include an oxide layer penetrating through the nitride layer and having a refractive index smaller than that of the nitride layer. Thus, the line pattern LP may function as a beam splitter that may be arranged in the anti-reflective layer.

Figure 6B:
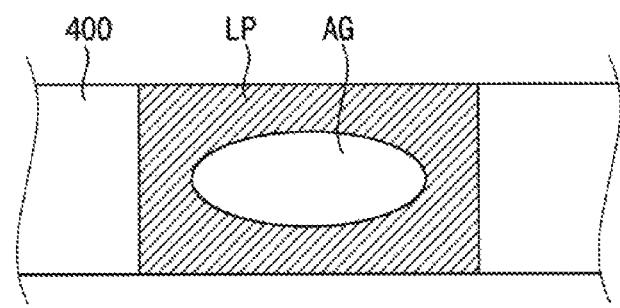

Particularly, an air gap AG may be further provided with the line pattern LP as shown in FIG. 6B, so an overall refractive index of the combination of the line pattern LP and the air gap AP may be smaller than that of the line patter LP.

Figure 6C:
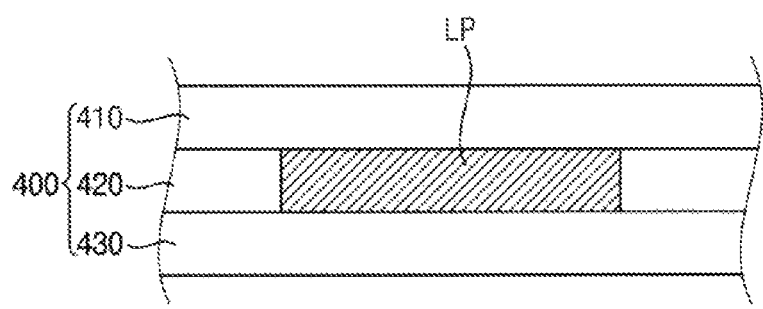

In another exemplary embodiment, when the buffer layer 400 may include a multilayer structure, the optical divider 500 may be provided in at least one of component layers of the multilayer structure, as shown in FIG. 6C.

Figure 6D:
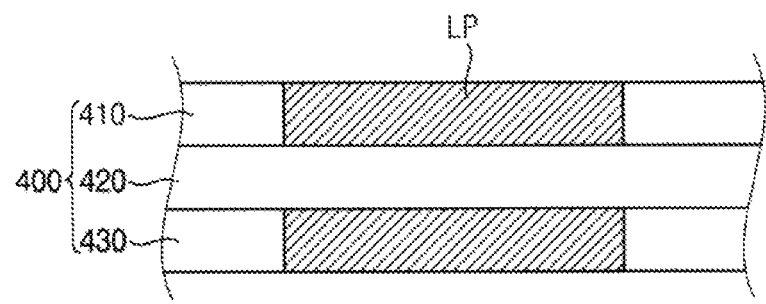

For example, when the buffer layer 400 may be formed into a multilayer structure in which an anti-reflective layer 410, a planarization layer 420 and a protection layer 430 may be sequentially stacked on the rear surface 102 of the substrate 100, the line pattern LP may be in the planarization layer 420, as shown in FIG. 6C, or may be in both of the anti-reflective layer 410 and the protection layer 430 at the boundary area of the photo diodes PD1 and PD2, as shown in FIG. 6D. The configurations of the line pattern LP may be varied according to the number of the component layers and material properties of the buffer layer 400 and the refractive index of the optical divider 500.

Figure 6E:
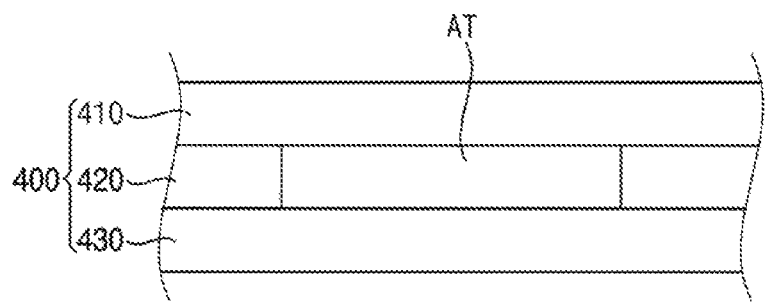

In still another exemplary embodiment, the optical divider 500 may include a line trench that may penetrate through the buffer layer 400 and be filled with air as an air trench AT, as shown in FIG. 6E. When the buffer layer 400 may include a multilayer structure, the air trench AT may be provided in a middle component layer of the multilayer structure in such a way that the air trench AT mat be covered with a lower component layer and an upper component layer of the multilayer structure in the boundary area of the photoelectric converters 200.

The light incident onto the unit pixel P may be divided by the optical divider 500 into the divided lights that may be directed to each of the photo diodes PD1 and PD2. Thus, the first and the second photo diodes PD1 and PD2 may be individually activated by the split lights, so the optical divider 500 may function as a light source for each photo diode PD1 and PD2.

In the present exemplary embodiment, the first and the second photo diodes PD1 and PD2 may be spaced apart in the first direction x and the optical divider 500 may be arranged on the boundary area of the first and the second photo diodes PD1 and PD2. Particularly, the line patter LP extending in a second direction y may be provided as the optical divider 500. The configurations of the optical divider 500 may be varied according to the structures and configurations of the photoelectric converters 200.

For example, when the photoelectric converter 200 may include four photo diodes in a shape of a 2×2 matrix, the optical divider 500 may include a mesh pattern having a latitudinal pattern and a longitudinal pattern. The latitudinal pattern may extend in the first direction x and may be arranged at a first boundary area by which the four photo diodes may be separated into two groups along the first direction x. In contrast, the longitudinal pattern may extend in the second direction y and may be arranged at a second boundary area by which the four photo diodes may be separated into two groups along the second direction y.

Figure 7A:
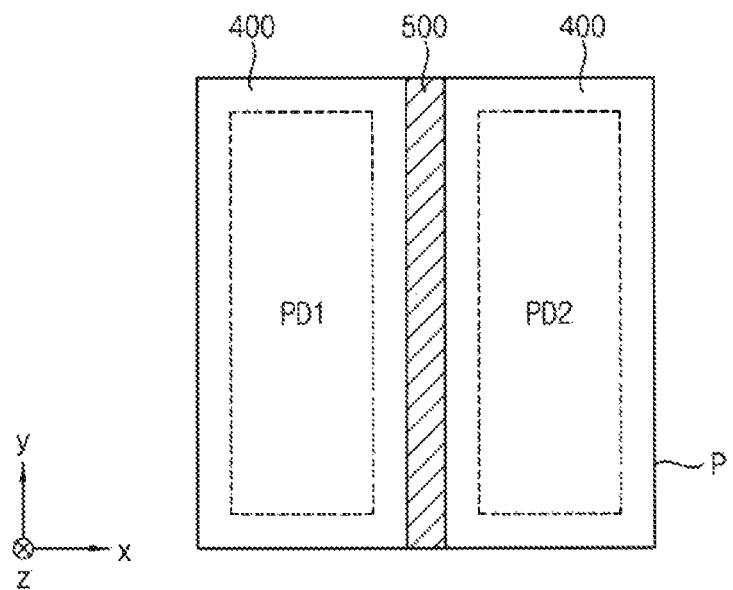
FIG. 7A is a plan view illustrating the optical divider shown in FIG. 6A.
Figure 7B:
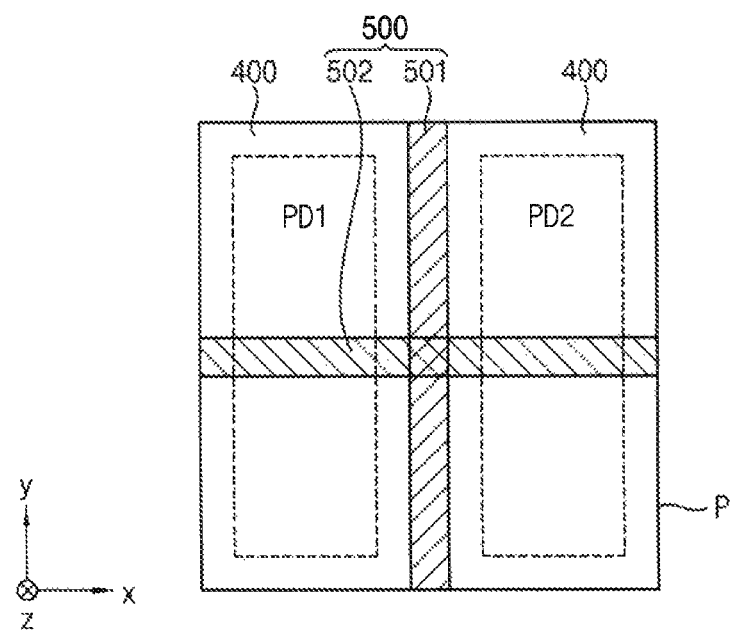
FIG. 7B is a plan view illustrating a modification of the optical divider shown in FIG. 7A.

FIG. 7A is a plan view illustrating the optical divider shown in FIG. 6A and FIG. 7B is a plan view illustrating a modification of the optical divider shown in FIG. 7A.

As shown in FIG. 7A, a pair of the photo diodes PD1 and PD2 may be arranged in the unit pixel P in such a configuration that the photo diodes PD1 and PD2 may be covered with the buffer layer 400 and may be spaced apart from each other in the first direction x. In addition, the optical divider 500 may be positioned at the boundary area between the photo diodes PD1 and PD2 in a shape of line pattern extending along the second direction y.

Since the refractive index of the optical divider 500 may be smaller than that of the buffer layer 400, the optical divider 500 may function as a beam splitter at the unit pixel P. Particularly, the optical divider 500 may be positioned at an incident point of the unit pixel P onto which the light may be incident. The incident point of the unit pixel P may be varied according to a relative position of the unit pixel in the image sensor 1000, so the position of the optical divider 500 may also be varied according to the corresponding unit pixel P.

When the light is obliquely incident onto the incident point of the unit pixel in the conventional image sensor in which no optical divider is arranged, the amount of light at each photo diode is varied according to the slant angle of the oblique light and the arrangements of the photo diodes. Therefore, the density of the photo electrons is necessarily different between the photo diodes and the intensity of the image signal is to be different between the photo diodes.

However, when the light may be obliquely incident onto the incident point of the unit pixel in the image sensor 1000 in which the optical divider 500 may be arranged, the oblique light may be divided into divided lights in such a way that the same amount of light may be supplied to each photo diode PD1 and PD2. That is, the optical divider 500 may function as a pseudo light source with respect to the first and the second photo diodes PD1 and PD2.

In such a case, since the optical divider 500 may control the light to be divided in such a way that the amount of light supplied to the first photo diode PD1 may be substantially the same as the amount of light supplied to the second photo diode PD2. Therefore, the density of the photo electrons of the first and the second photo diodes PD1 and PD2 may be the same irrespective of the slant angle of the oblique light.

The amount of light at the photo diodes PD1 and PD2, i.e., the intensity of the divided light at the photo diodes PD1 and PD2, may be varied according to the slant angle of the oblique light that may be incident to the unit sensor P and the configurations of the photo diodes PD1 and PD2. Thus, the position and configurations of the optical divider 500 may be changed according to the slant angle of the oblique light and the configurations of the photo diodes PD1 and PD2.

As shown in FIG. 7B, the optical divider 500 may include a first divider 501 extending in the second direction y and arranged at the boundary area between the photo diodes PD1 and PD2 and a second divider 502 extending in the first direction x over the photo diodes PD1 and PD2. That is, the optical divider 500 may be shaped into a cross pattern on the unit pixel P in such a configuration that the first divider 501 may extend on the boundary area between the photo diodes PD1 and PD2 and the second divider 502 may cross the first divider 501 and partially overlap the photo diodes PD1 and PD2.

When the oblique light may be divided into the divided lights by the first divider 501 and the divided lights may travel to each of the photo diodes PD1 and PD2, respectively, an asymmetrical cross talk between the photo diodes PD1 and PD2 may occur by optical scattering of the first divider 501. The asymmetrical cross talk may increase the interferences between the image signals of the photo diodes PD1 and PD2, thereby deteriorating the image quality of the image sensor such as a noise due to the signal interferences. For that reason, the second divider 502 may be arranged in perpendicular to the first divider 501 for guiding the divided light to the respective photo diode PD1 and PD2, thereby improving the cross talk symmetry at the unit pixel P.

The color filter CF and the micro lens ML may be arranged on the buffer layer 400 at every unit pixel P. Thus, a plurality of the color filters CF on each of the unit pixels P may constitute a matrix-shaped color filter array. In an example embodiment, the color filter array may include a Bayer pattern having a red filter, blue filter and a green filter. In another example embodiment, the color filter array may include a yellow filter, a magenta filter and a cyan filter. A specific light having a specific wavelength may pass through the color filter CF and reach the unit pixel P under the corresponding color filter CF.

Since the color filter CF and the micro lens ML may be arranged at every unit pixel P, the photo diodes PD1 and PD2 in the unit pixel P may share the color filter CF and the micro lens ML. In the present exemplary embodiment, the Bayer pattern may be arranged on the image sensor 1000 as the color filter array, so only the primary color light having its own wavelength, such as a red light, a blue light and a green light may pass through the color filter CF and one of the primary color lights may reach the corresponding unit pixel P. Hereinafter, the unit pixel P onto which the red light may be incident will be referred to as red pixel and the unit pixel P onto which the blue light may be incident will be referred to as blue pixel. In the same way, the unit pixel P onto which the green light may be incident will be referred to as green pixel.

Hereinafter, when the oblique light is divided into divided lights and the same amount of light is supplied to each of the photo diodes, the phase difference auto focusing (PAF) process using the focal phase of the unit pixel will be described in detail.

Figure 8A:
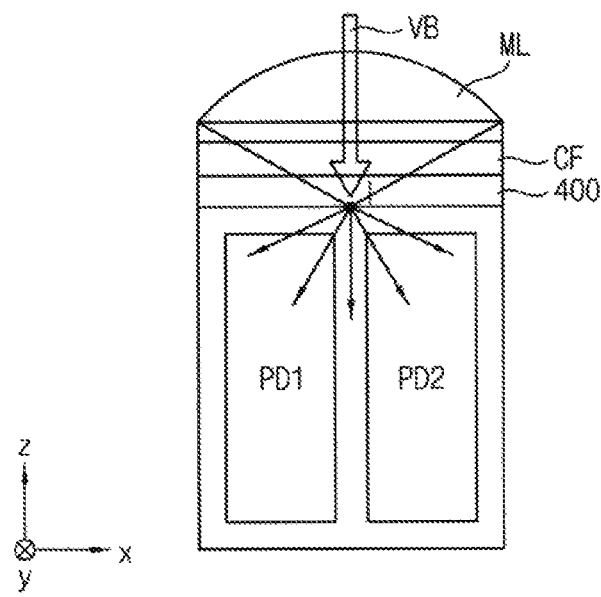
FIG. 8A is a view illustrating optical paths of light toward the photo diodes when the light is vertically incident to a central unit pixel of the conventional dual pixel image sensor.
Figure 8B:
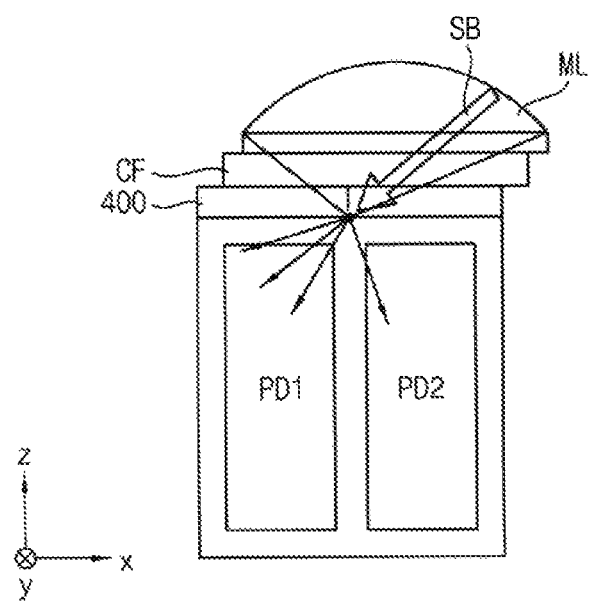
FIG. 8B is a view illustrating optical paths of light toward the photo diodes when the light is obliquely incident to a peripheral unit pixel of the conventional dual pixel image sensor.

FIG. 8A is a view illustrating optical paths of light toward the photo diodes when the light is vertically incident to a central unit pixel of the conventional dual pixel image sensor and FIG. 8B is a view illustrating optical paths of light toward the photo diodes when the light is obliquely incident to a peripheral unit pixel of the conventional dual pixel image sensor.

As shown in FIGS. 8A and 8B, the focal point or the focal distance of an image sensor may be controlled on a basis of the central portion of the image sensor with respect to an object. Thus, when the auto focusing process is completed and the focus point of the image sensor is accurately set with respect to the object, the light is vertically incident onto a central portion of the image sensor through an optical lens of a camera in which the image sensor is installed. Therefore, the light passing through the optical lens is obliquely incident onto a peripheral portion of the image sensor with a slant angle. Hereinafter, the primary color light that may be filtered by the color filter and may be vertically incident onto the central unit pixel of the image sensor will be referred as a vertical beam VB, while the primary color light that may be filtered by the color filter and may be obliquely incident onto the peripheral unit pixel of the image sensor with a slant angle will be referred as a slanted beam SB.

Thus, the vertical beam VB and the slanted beam SB of the conventional image sensor need be controlled to travel to the same focal point. Thus, the micro lens ML and the color filter CF on the peripheral unit cell are shifted in such a way that the slanted beam SB may travel to the focal point of the image sensor, while no shift is conducted to the micro lens ML and the color filter CF on the central unit cell. Therefore, each incident point I of a corresponding unit pixel P to which the light is incident is necessarily different for each of the unit pixels for a single focal point of the image sensor. That is, the incident point is uniquely determined at each of the unit pixels of the image sensor.

As shown in FIG. 8A, the vertical beam VB may be incident to the incident point I of the central unit pixel of the conventional image sensor and may be uniformly scattered ahead along a travel direction of the vertical beam VB. Thus, the photo diodes PD1 and PD2 may receive substantially the same amount of light, and the image signals generated from each of the photo diodes PD1 and PD2 have substantially the same intensity. Accordingly, the cross points of the image signals generated from the red, blue and green pixels are distributed sufficiently close to one another in the image signal graph, thus the phase difference of each cross points of the image signals are substantially negligible regardless of the wavelength of the vertical beam VB which is one of the red light, blue light and the green light. Therefore, the phase of each cross points of the image signals are set to be the focal phase of the conventional image sensor.

However, as shown in FIG. 8B, the slanted beam SB may be incident to the incident point I of the peripheral unit pixel of the conventional image sensor and may be uniformly scattered ahead along a travel direction of the slanted beam SB. Thus, the amount of light at the first photo diode PD1 is much larger than the amount of light at the second photo diode PD2, and the intensity of the image signals generated from the first photo diode PD1 may be much stronger than the intensity of the image signals generated from the second photo diode PD2. Accordingly, the cross points of the image signals generated from the red, blue and green pixels are distributed sufficiently scarcely from one another in the image signal graph, thus the phases of each cross points of the image signals are significantly different from one another according to the wavelength of the slanted beam SB which is one of the red light, blue light and the green light. Therefore, since the phase difference among each cross points of the image signals are sufficiently large, the focal phase cannot be determined at the peripheral portion of the image sensor and thus the focal phase cannot coincide between the central portion and the peripheral portion of the image sensor, which makes it difficult to conduct the auto focusing in the conventional dual pixel image sensor.

For solving the above AF difficulties, the color filter CF and the micro lens ML on the peripheral unit pixel of the conventional image sensor are shifted rightwards for compensating for the amount gap of light between the first and the second photo diodes PD1 and PD2, as shown in FIG. 8B. However, the phases of each cross points of the image signals are not sufficiently close to one another in the image signal graph in spite of the shift of the color filter CF and the micro lens ML, which is caused by the difference of the transmitting depths into the substrate of the image sensor according to the red pixel, blue pixel and the green pixel.

Among the blue light, red light and the green light, the blue light has the shortest wavelength and thus the transmitting depth of the blue light is shortest, while the red light has the longest wavelength and thus the transmitting depth of the red light is longest. Thus, although the slanted beam SB is incident onto the blue pixel, red pixel and the green pixel at the same slant angle, respectively, the amount of light at the photo diodes PD1 and PD2 is varied according to the blue pixel, red pixel and the green pixel due to the difference of the transmitting depth. Accordingly, the cross points of the image signals generated from the red, blue and green pixels are still distributed scarcely from one another in the image signal graph, thus the phases of each cross points of the image signals are significantly different from one another according to the wavelength of the slanted beam SB.

Figure 8C:
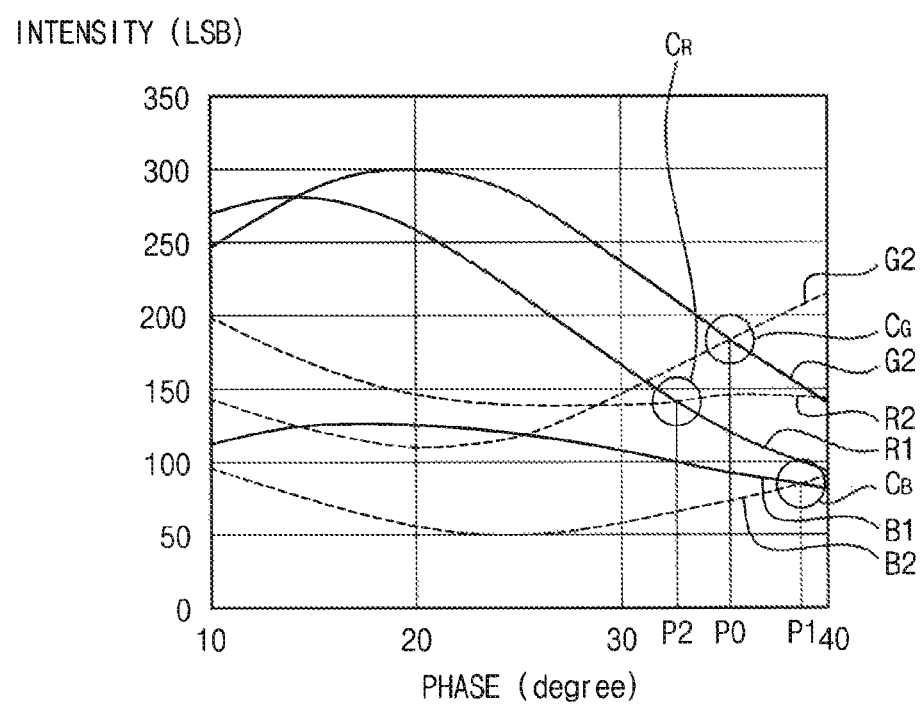
FIG. 8C is an image signal graph showing a response characteristics of the image signals generated from the conventional red, blue and green pixels.

FIG. 8C is an image signal graph showing a response characteristics of the image signals generated from the conventional red, blue and green pixels. In FIG. 8C, the image signals are measured from the conventional red, blue and green pixels in which the corresponding color filter and the micro lens are shifted as shown in FIG. 8B.

As shown in FIG. 8C, the focus phase of image signals generated from the red, blue and green pixels are sufficiently from one another in spite of the shift of the color filter and the micro lens.

A pair of red image signals R1 and R2 generated from the red pixel makes a red cross point $C_R$, and a pair of blue image signals B1 and B2 generated from the blue pixel makes a blue cross point $C_B$. In addition, a pair of green image signals G1 and G2 generated from the green pixel makes a green cross point $C_G$. Therefore, the red phase P2 of the red cross point $C_R$ is detected as a minimal phase and the blue phase P1 of the blue cross point $C_B$ is detected as a maximal phase. The green phase P0 of the green cross point $C_G$ is detected between the blue phase P1 of the blue cross point $C_B$ and the red phase P2 of the red cross point $C_R$. In such a case, the signal intensity is smallest at the blue cross point $C_B$ and is largest at the green cross point $C_G$, because the blue light has the deepest transmitting depth and the number of the green pixel is larger than those of the blue pixel and the red pixel in the mosaic pixel of the conventional image sensor.

The image signal graph shows that the blue phase P1, the red phase P2 and the green phase P0 significantly different from one another in the mosaic pixel, which deteriorates the image quality of the image sensor.

Figure 9A:
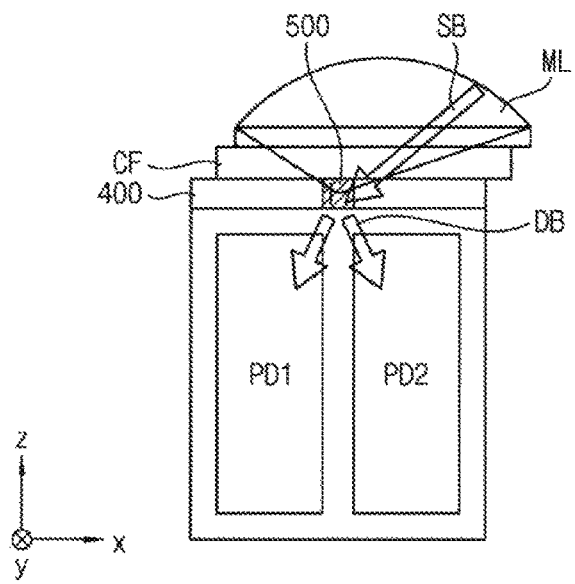
FIG. 9A is a view illustrating optical paths of light toward the photo diodes when the light is obliquely incident to a peripheral unit pixel of the dual pixel image sensor shown in FIG. 1.
Figure 9B:
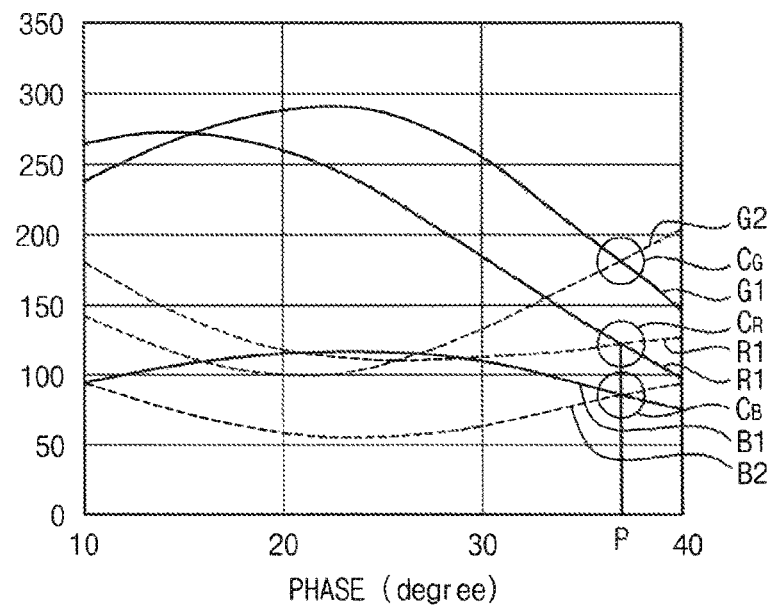
FIG. 9B is an image signal graph showing a response characteristics of the image signals generated from the unit pixel shown in FIG. 9A.

FIG. 9A is a view illustrating optical paths of light toward the photo diodes when the light is obliquely incident to a peripheral unit pixel of the dual pixel image sensor shown in FIG. 1. FIG. 9B is an image signal graph showing a response characteristics of the image signals generated from the unit pixel shown in FIG. 9A. In FIG. 9B, the image signals are measured from the conventional red, blue and green pixels.

As shown in FIG. 9A, the optical divider 500 may be positioned on the boundary area of the photo diodes PD1 and PD2 in the unit pixel P and the incident point I may be overlapped with the optical divider 500. Thus, the slanted beam SB may be divided into a pair of divided beams DB.

In such a case, the optical divider 500 may be configured in such a way that the divided beams may supply the same amount of light to the first and the second photo diodes PD and PD2. Thus, the optical divider 500 may divide the slanted beam SB that may be incident onto the incident point I in view of the slant angle of the slanted beam SB in such way that the first and the second photo diodes PD1 and PD2 may receive the same amount of light by the divided beams DB.

The divided beams DB may function as an individual light that may travel to the first and the second photo diodes PD1 and PD2 independently from each other from the optical divider 500. For example, the optical divider 500 may include a beam splitter for bisecting the slanted beam SB into a pair of the divided beams having the same amount of light.

Since the divided beams DB having the same wavelength may travel to the first and the second photo diodes PD1 and PD2 at the same intensity, the image signals generated from the first and the second photo diodes PD1 and PD2 may have substantially the same intensity. Accordingly, the cross point of the image signals may have similar phase irrespective of the wavelength of the slanted beam SB, so that the phase difference of each cross points of the image signals generated from the red, blue and green pixels are substantially negligible regardless of the wavelength of the slanted beam SB.

FIG. 9B indicates that the red cross point $C_R$ of the red image signals R1 and R2, the blue cross point $C_B$ of the blue image signals B1 and B2 and the green cross point $C_G$ of the green image signals G1 and G2 may have the same common phase P, while the red, blue and the green image signals may have different signal intensities. Although the common phase P of the red, blue and green cross points of the image signals may be detected from the peripheral portion of the image sensor 1000, the common phase P may be substantially the same as the focal phase that may be detected from the central portion of the image sensor 1000.

Therefore, the image sensor 1000 may be accurately focused to have substantially the same focal phase between the central portion and peripheral portion of thereof due to the phase different auto focusing (PAF), thereby increasing the image quality of the image sensor 1000.

While the present exemplary embodiment discloses that the optical divider 500 may be arranged at the peripheral unit pixel of the image sensor 1000, the optical divider 500 may also be arranged at the central unit pixel as well as at the peripheral unit pixel of the image sensor 1000.

Since the vertical beam VB may be incident onto the central unit pixel of the image sensor 1000, the amount difference of light between the photo diodes PD1 and PD2 in the central unit pixel may be much smaller than that between the photo diodes PD1 and PD2 in the peripheral unit cell of the image sensor 1000. However, the dividing or splitting of the vertical beam VB into a pair of the divided beams DB having the same amount of light may also increase the accuracy of the focal phase at the central portion of the image sensor 1000.

The configurations of the optical divider 500 may be modified as the corresponding unit pixel P may approach from the central portion to the peripheral portion of the image sensor 1000 in view of the slant angle and the travel direction of the slanted beam SB.

Figure 10:
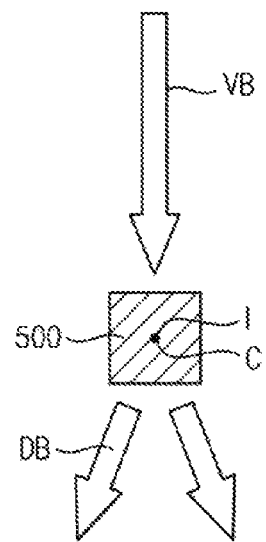
FIG. 10 is a view illustrating optical paths of light when the vertical beam is divided by the optical divider at the central unit pixel of the image sensor.

FIG. 10 is a view illustrating optical paths of light when the vertical beam is divided by the optical divider at the central unit pixel of the image sensor.

As shown in FIG. 10, the light passing through the optical lens may be vertically incident onto the incident point I of the central unit pixel of the image sensor 1000, and then may be divided into a pair of the divided beam DB by the optical divider 500. The divided beams DB may travel toward the first and the second photo diodes PD1 and PD2, respectively.

In such a case, the optical divider 500 may be arranged on the central unit pixel in such a configuration that the geometrical center C of the optical divider 500 may coincide with the incident point I, so the divided beams DB may have substantially the same intensity.

However, when the light passing through the optical lens may be obliquely incident onto the incident point I of the unit pixel that may be spaced apart from the central portion of the image sensor 1000, the configurations of the optical divider 500 may be adjusted in view of the slant angle of the oblique light in such a way that the first and the second photo diodes PD1 and PD2 may receive the same amount of light by the divided beams DB.

Figure 11A:
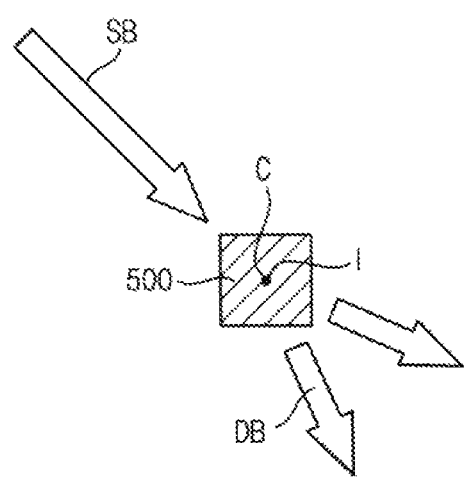
FIGS. 11A and 11B are views illustrating optical paths of light when the slanted beam is divided by the optical divider at a left peripheral unit pixel of the image sensor.
Figure 11B:
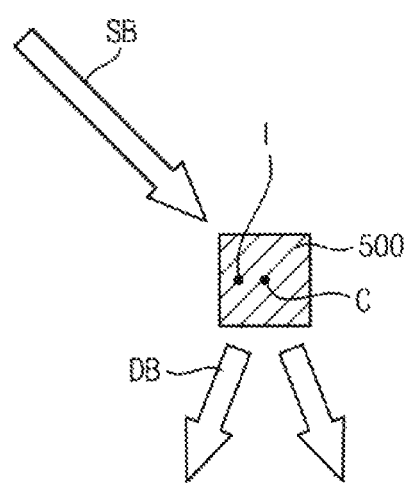

FIGS. 11A and 11B are views illustrating optical paths of light when the slanted beam is divided by the optical divider at a left peripheral unit pixel of the image sensor. The optical divider in FIG. 11A has substantially the same configurations as the optical divider in FIG. 10, and the optical diver in FIG. 11B has modified configurations in such a way that the first and the second photo diodes PD1 and PD2 may receive substantially the same amount of light.

As shown in FIG. 11A, when the slanted beam SB travels downward to the right toward the left peripheral unit pixel of the image sensor 1000 and the optical divider 500 may be arranged in such a way that the geometrical center C of the optical divider 500 may coincide with the incident point I, the slanted beam SB may be divided into a pair of the divided beams DB having the same amount of light along a travel direction. Thus, a relatively larger portion of the divided beams DB may travel to a right portion of the unit pixel and the second photo diode PD2 may receive relatively larger amount of light than the first photo diode PD1.

For reducing the amount difference of light between the first and the second photo diodes PD1 and PD2, the optical divider 500 may be shifted rightwards in the first direction x in such a way that the incident point I may be positioned on a left side of the geometrical center C of the optical divider 500, as shown in FIG. 11B. Thus, the slanted beam SB may be divided into a pair of the divided beams DB that may be symmetrical with respect to a central axis passing through the geometrical center C of the optical divider 500. Therefore, the divided beams DB may travel uniformly leftwards and rightwards with respect to the central axis of the optical divider 500 and the first and the second photo diodes PD1 and PD2 may receive substantially the same amount of light.

The shift distance of the optical divider 500 may be varied according to the slant angle of the slanted beam SB. Since the slant angle of the slant beam SB may be small around the central portion of the image sensor 1000, the shift distance of the optical divider 500 may also be smaller as the unit cell may approach the central portion of the image sensor 1000. In contrast, the shift distance of the optical divider 500 may also be larger as the unit cell may approach the peripheral portion of the image sensor 1000 because the slant angle of the slant beam SB may be large around the peripheral portion of the image sensor 1000. In the present example embodiment, the shift distance of each optical divider 500 may be determined in such a way that the total amount of light of the slanted beams SB at each unit pixel P may be maximized, so the optical intensity of each unit pixel P may be maximized by the shift of the optical divider 500. That is, the incident light may be divided into the split beams SB by the optical divider 500 in such a way that the first and the second photo diodes PD1 and PD2 may receive the same amount of light and the optical divider 500 may be shifted individually at each unit pixel P in such a way that the total optical intensity of both of the photo diodes PD1 and PD2 may be maximized. Accordingly, an overall optical intensity and uniformity of the unit pixel P may be sufficiently improved by the optical divider 500.

When the shift of the optical divider 500 may be insufficient for the equal dividing of the slanted beam SB, any other properties such as material properties and overall shapes may also be changed in order that the first and the second photo diodes PD1 and PD2 may receive the same amount of light by the divided beams DB.

When the slanted beam SB may travel in the left down toward the right peripheral unit pixel of the image sensor 1000, the optical divider 500 may be shifted leftwards in the first direction x in such a way that the incident point I may be positioned on a right side of the geometrical center C of the optical divider 500. Thus, the slanted beam SB may be divided into a pair of the divided beams DB that may be symmetrical with respect to the central axis passing of the optical divider 500. Therefore, the divided beams DB may travel uniformly leftwards and rightwards with respect to the central axis of the optical divider 500 and the first and the second photo diodes PD1 and PD2 may receive substantially the same amount of light.

Therefore, the configurations of the optical divider 500 may be properly modified at each of the unit pixel in view of the slant angle of the slanted beam SB, the proximity of the unit cell toward the central portion of the image sensor 1000 and the travel direction of the slanted beam SB, so a plurality of the photoelectric converters 200 in the unit pixel P may receive the same amount of light regardless of the relative positions of the unit pixel in the image sensor and regardless of the wavelength of the slanted beam SB, thereby accurately obtaining the focal phase of the cross points of the image signals in the image sensor 1000.

While the present exemplary embodiment discloses the optical divider 500 may be applied to the image sensor 1000 having a back side illumination (BSI) structure, the optical divider 500 may also be applied to any other image sensors as long as the image sensor may include a plurality of photoelectric converters in a unit pixel.

Accordingly, the optical divider 500 having the refractive index smaller than surroundings may be arranged on the boundary area of the photoelectrical converters 200 and may be overlapped with the incident point I at every unit pixel of the image sensor. Thus, the photoelectric converters may have substantially the same amount of light and the image signals generated from each of the photoelectric converters 200 may have substantially the same intensity. As a result, the cross point of the image signals generated from each of the photoelectric converters 200 may have similar phase irrespective of the wavelength of the slanted beam SB, so that the phase difference of each cross points of the image signals generated from the red, blue and green pixels are substantially negligible regardless of the wavelength of the slanted beam SB, thereby increasing the accuracy of the phase different auto focusing (PAF) and the image quality of the image sensor 1000.

Figure 12:
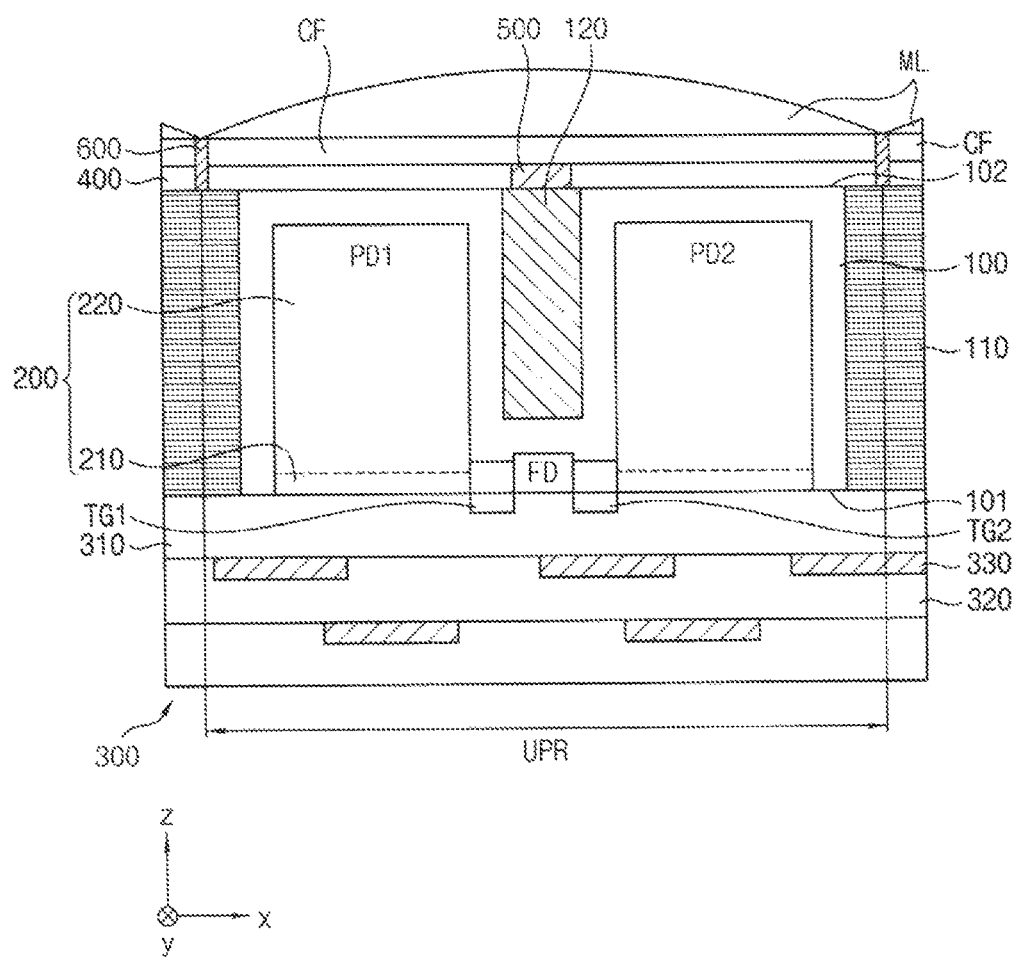
FIG. 12 is a structural view illustrating an image sensor in accordance with another example embodiment.
Figure 13:
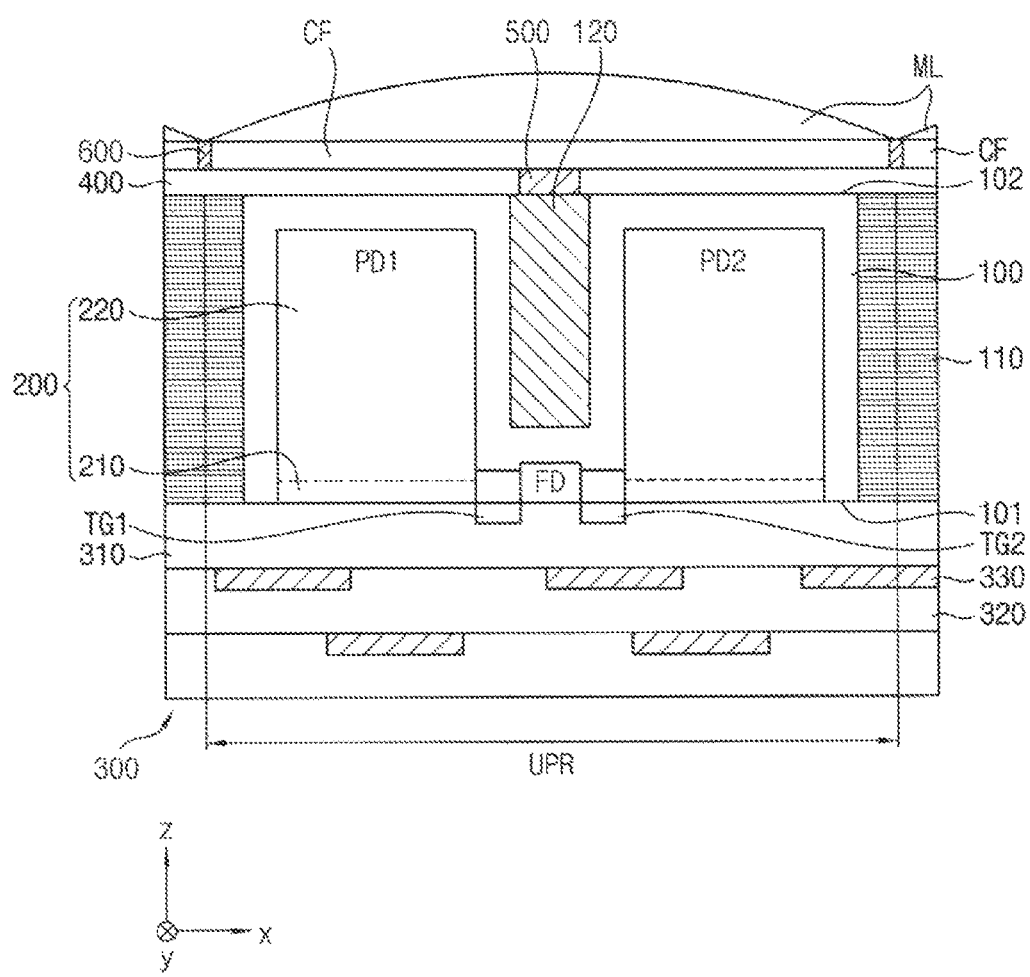
FIG. 13 is a structural view illustrating a modification of the image sensor shown in FIG. 12.

FIG. 12 is a structural view illustrating an image sensor in accordance with another example embodiment. FIG. 13 is a structural view illustrating a modification of the image sensor shown in FIG. 12. The image sensors in FIGS. 12 and 13 may have substantially the same structures as the image sensor 1000 shown in FIG. 5, except that a grid pattern 600 may be arranged on the pixel isolation layer 110 for guiding the light to the unit pixel P. In FIGS. 12 and 13, the same reference numerals denote the same elements in FIG. 5, and any further detailed descriptions of the same elements will be omitted.

As shown in FIG. 12, a grid pattern 600 may be arranged on the pixel isolation layer 110 through the buffer layer 400. For example, the grid pattern 600 may be provided as a line pattern enclosing the unit pixel P and may comprise light shielding materials. Particularly, the grid pattern 600 may include a closed line in the buffer layer 400 that may be shaped into a ring enclosing the unit pixel P.

The micro lens ML may make contact with the grid pattern 600 at each unit pixel P, so the grid pattern 600 may define an edge portion of the micro lens ML and the unit pixel P. That is, the unit pixel P may be arranged inside of the closed grid pattern 600 and may be covered with the micro lens ML. The color filter CF and the buffer layer 400 may be separated by the grid pattern 600 by a unit of the unit pixel P.

When the slanted beam SB filtered by the color filter CF may be incident onto the unit pixel P, some of the slanted beam SB may travel toward the edge portion of the unit pixel P and may be incident to the neighboring unit pixel, thereby generating the cross talk and noise defect.

In such a case, the slanted beam SB traveling toward the edge portion of the unit pixel P may be reflected toward the unit pixel by the grid pattern and thus may be prevented from being incident to the neighboring unit pixel. Thus, the cross talk defect between the neighboring unit pixels may be sufficiently prevented and the image quality of the image sensor may be improved.

As shown in FIG. 13, the grid pattern 600 may be modified to be arranged just on the buffer layer 400 without penetrating through the buffer layer 400, so that the buffer layer 400 may not be separated by a unit of the unit pixel P. That is, just only the color filter CF may be separated by the grid pattern 600 by a unit of the unit pixel P.

According to the exemplary embodiments of the image sensor, the optical divider having the refractive index smaller than surroundings may be arranged on the boundary area of the photoelectrical converters and may be overlapped with the incident point at every unit pixel of the image sensor. Thus, the photoelectric converters may have substantially the same amount of light and the image signals generated from each of the photoelectric converters may have substantially the same intensity. As a result, the cross point of the image signals generated from each of the photoelectric converters may have similar phase irrespective of the wavelength of the slanted beam, so that the phase difference of each cross points of the image signals generated from the red, blue and green pixels are substantially negligible regardless of the wavelength of the slanted beam, thereby increasing the accuracy of the phase different auto focusing (PAF) and the image quality of the image sensor.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An image sensor comprising:
a plurality of unit pixels defined by a pixel isolation layer on a substrate;
at least a pair of photoelectric converters in each of the unit pixels, the photoelectric converters being separated by at least a converter separator in each of the unit pixels and generating photo electrons in response to an incident light that is incident to an incident point of the respective unit pixel; and
at least an optical divider on a rear surface of the substrate at each of the unit pixels, the optical divider being overlapped with the incident point and dividing the incident light into a plurality of split lights, each split light having substantially the same amount of light such that each of the photoelectric converters receives substantially the same amount of light from the split lights.

2. The image sensor of claim 1, further comprising:
a buffer layer on the rear surface of the substrate;
a color filter on the buffer layer at each of the unit pixels to selectively transmit the incident light having a specific wavelength; and
a micro lens on the color filter,
wherein the optical divider is arranged on a boundary area between the photoelectric converters and has a refractive index smaller than that of the buffer layer.

3. The image sensor of claim 2, wherein the pair of the photoelectric converters include a pair of p-n junction diodes that are spaced apart from each other by the boundary area in a first direction, and the optical divider includes a longitudinal line pattern extending along a second direction substantially perpendicular to the first direction in the buffer layer such that an upper surface of the optical divider is coplanar with an upper surface of the buffer layer.

4. The image sensor of claim 3, wherein the optical divider includes a latitudinal line pattern extending along the first direction in the buffer layer such that an upper surface of the optical divider is coplanar with an upper surface of the buffer layer, so that the optical divider is shaped into a cross pattern of the longitudinal line pattern and the latitudinal line pattern.

5. The image sensor of claim 4, wherein at least one of the latitudinal line pattern and the longitudinal line pattern includes an air gap.

6. The image sensor of claim 3, wherein the buffer layer includes a multi layer having a plurality of component layers and the optical divider is provided in one of the component layers.

7. The image sensor of claim 3, wherein the buffer layer includes a multi layer having a plurality of component layers and the optical divider is provided in both an uppermost component layer and a lowermost component layer.

8. The image sensor of claim 3, wherein the buffer layer includes a multi layer having a plurality of component layers and the optical divider is in contact with the converter separator through the multi layer.

9. The image sensor of claim 3, wherein the optical divider is arranged in such a way that the incident point is positioned at one of left sides of a geometrical center of the optical divider when the incident light obliquely travels toward the respective unit pixel in a respective direction of right and left downward directions.

10. The image sensor of claim 3, wherein the buffer layer includes a multi layer having a plurality of component layers and the optical divider includes a line trench extending in a second direction perpendicular to the first direction and filled with air.

11. The image sensor of claim 1, wherein the pixel isolation layer includes an insulation material having a refractive index smaller than that of the substrate and the converter separator includes an insulation material having a refractive index larger than or equal to that of the optical divider and smaller than that of the substrate.

12. The image sensor of claim 1, further comprising a plurality of grid patterns partially overlapping with the pixel isolation layer, each of the grid patterns enclosing the respective unit pixel and reflecting the incident light that is obliquely incident to a peripheral portion of the respective unit pixel to a central portion of the respective unit pixel.

13. An image sensor comprising:
a pixel array including a plurality of unit pixels defined by a pixel isolation layer into a matrix shape on a substrate, a plurality of photoelectric converters in each of the unit pixels, the photoelectric converters being separated by at least one converter separator and generating photo electrons in response to an incident light that is incident to an incident point of the respective unit pixel, and at least an optical divider on a rear surface of the substrate at each of the unit pixels, the optical divider being overlapped with the incident point and dividing the incident light into a plurality of split lights having substantially the same amount of light such that each of the photoelectric converters receives substantially the same amount of light from the split lights; and
an image signal processor electrically connected to the pixel array and processing a plurality of image signals from the unit pixels in response to the incident light.

14. The image sensor of claim 13, further comprising:
a buffer layer on the rear surface of the substrate;
a color filter on the buffer layer at each of the unit pixels to selectively transmit the incident light having a specific wavelength; and
a micro lens on the color filter,
wherein the optical divider is arranged on a boundary area between the photoelectric converters in each of the unit pixels and has a refractive index smaller than that of the buffer layer.

15. The image sensor of claim 14, wherein the plurality of photoelectric converters include a pair of p-n junction diodes that are spaced apart from each other in each of the unit pixels by the boundary area in a first direction, and the optical divider includes a line pattern extending along the boundary area in the buffer layer.

16. The image sensor of claim 14, wherein the buffer layer includes a multi layer having a plurality of component layers and the optical divider includes a line trench extending along the boundary area and filled with air.

17. An image sensor comprising:
a pixel array for generating image signals comprising a plurality of unit pixels arranged on a substrate, the unit pixels being isolated from each other by pixel isolation layers disposed between adjacent unit pixels, each of the unit pixels comprising at least two photoelectric converters separated from each other by at least one converter separator, and each photoelectric converter receiving substantially the same amount light from an optical divider that splits an incident light that is incident on the respective unit pixel;

a floating diffusion area in a front surface of the substrate at the respective unit pixel, the floating diffusion area being disposed between the photoelectric converters, and an image signal processor for processing the image signals received from the pixel array, wherein the optical divider is disposed on a rear surface of the substrate at the respective unit pixel and overlapped with the floating diffusion area.

18. The image sensor of claim 17, further comprising:

a buffer layer on a rear surface of the substrate;

a color filter on the buffer layer at each of the unit pixels to selectively transmit the incident light having a specific wavelength; and a micro lens on the color filter, wherein the optical divider is arranged on a boundary area between the photoelectric converters and has a refractive index smaller than that of the buffer layer.

19. The image sensor of claim 18, further comprising a grid pattern disposed on the respective pixel isolation layer for guiding the incident light from the optical divider to the respective unit pixel.

20. The image sensor of claim 18, further comprising a grid pattern disposed on the buffer layer and above the respective pixel isolation layer for guiding the incident light from the optical divider to the respective unit pixel.

* * * * *